US006629341B2

(12) United States Patent
Wilkie et al.

(10) Patent No.: US 6,629,341 B2
(45) Date of Patent: Oct. 7, 2003

(54) METHOD OF FABRICATING A PIEZOELECTRIC COMPOSITE APPARATUS

(75) Inventors: W. Keats Wilkie, Williamsburg, VA (US); Robert G. Bryant, Newport News, VA (US); Robert L. Fox, Hayes, VA (US); Richard F. Hellbaum, Hampton, VA (US); James W. High, Norfolk, VA (US); Antony Jalink, Jr., Newport News, VA (US); Bruce D. Little, Gloucester, VA (US); Paul H. Mirick, Grafton, VA (US)

(73) Assignee: The United States of America as represented by the Administrator of the National Aeronautics and Space Administration, Washington, DC (US)

( * ) Notice: Subject to any disclaimer, the term of this patent is extended or adjusted under 35 U.S.C. 154(b) by 0 days.

(21) Appl. No.: 09/430,677

(22) Filed: Oct. 29, 1999

(65) Prior Publication Data

US 2003/0056351 A1 Mar. 27, 2003

(51) Int. Cl.$^7$ .............................................. H04R 17/00
(52) U.S. Cl. .................... 29/25.35; 29/594; 29/595; 29/609.1; 310/328; 310/334; 310/336; 156/222; 156/299; 156/300; 156/301
(58) Field of Search ............................ 29/25.35, 594, 29/595, 609.1, 832, 837, 840; 310/357, 358, 327, 328, 333, 366, 367, 334, 336; 156/222, 299, 300, 301; 427/96, 100

(56) References Cited

U.S. PATENT DOCUMENTS

| 4,250,603 A | 2/1981 | Luft | 29/25.35 |
| 4,479,069 A | 10/1984 | Miller | 310/334 |
| 4,613,784 A * | 9/1986 | Haun | 310/358 |
| 4,747,192 A | 5/1988 | Rokurota | 29/25.35 |

(List continued on next page.)

OTHER PUBLICATIONS

MIDE Technology Corporation, Product Information Sheet, Flexible Piezoelectric Technology, 8/99, 2 pgs.
A. A. Bent, "Active fiber composite material systems for structural control applications", SPIE Proceedings, Newport Beach, CA, Mar. 2–4, 1999, pp. 166–177.
A. A. Bent et al., "Improved performance in piezoelectric fiber composites using interdigitated electrodes", SPIE vol. 2441, San Diego, CA, Feb. 27–28, 1995, pp. 196–212.
J. P. Rodgers et al., "Characterization of interdigitated electrode piezoelectric fiber composites under high electrical and mechanical loading", SPIE vol. 2717, San Diego, CA, Feb. 26–29, 1996, pp. 642–659.

(List continued on next page.)

Primary Examiner—A. Dexter Tugbang
Assistant Examiner—Paul D. Kim
(74) Attorney, Agent, or Firm—Kurt G. Hammerle (57) ABSTRACT

A method for fabricating a piezoelectric macro-fiber composite actuator comprises providing a piezoelectric material that has two sides and attaching one side upon an adhesive backing sheet. The method further comprises slicing the piezoelectric material to provide a plurality of piezoelectric fibers in juxtaposition. A conductive film is then adhesively bonded to the other side of the piezoelectric material, and the adhesive backing sheet is removed. The conductive film has first and second conductive patterns formed thereon which are electrically isolated from one another and in electrical contact with the piezoelectric material. The first and second conductive patterns of the conductive film each have a plurality of electrodes to form a pattern of interdigitated electrodes. A second film is then bonded to the other side of the piezoelectric material. The second film may have a pair of conductive patterns similar to the conductive patterns of the first film.

15 Claims, 6 Drawing Sheets

U.S. PATENT DOCUMENTS

| | | | | |
|---|---|---|---|---|
| 4,939,826 A | * | 7/1990 | Shoup | 29/25.35 |
| 5,239,736 A | | 8/1993 | Sliwa, Jr. et al. | 29/25.35 |
| 5,340,510 A | | 8/1994 | Bowen | 264/22 |
| 5,527,480 A | | 6/1996 | Bailey et al. | 252/62.9 |
| 5,539,965 A | | 7/1996 | Safari et al. | 29/25.35 |
| 5,645,753 A | | 7/1997 | Fukuoka et al. | 252/62.9 PZ |
| 5,656,882 A | | 8/1997 | Lazarus et al. | 310/328 |
| 5,687,462 A | | 11/1997 | Lazarus | 29/25.35 |
| 5,692,279 A | | 12/1997 | Mang et al. | 29/25.35 |
| 5,702,629 A | | 12/1997 | Cui et al. | 252/62.9 R |
| 5,849,125 A | | 12/1998 | Clark | 156/222 |
| 5,860,202 A | | 1/1999 | Okawa et al. | 29/25.35 |
| 5,869,189 A | | 2/1999 | Hagood, IV et al. | 428/461 |
| 5,874,868 A | | 2/1999 | Shimoe | 333/193 |
| 5,977,691 A | * | 11/1999 | Stephens et al. | 310/334 |
| 6,038,752 A | * | 3/2000 | Finsterwald et al. | 29/25.35 |
| 6,043,588 A | * | 3/2000 | Tabota et al. | 310/329 |
| 6,048,622 A | | 4/2000 | Hagood, IV et al. | 428/461 |
| 6,069,433 A | | 5/2000 | Lazarus et al. | |
| 6,088,894 A | * | 7/2000 | Oakley et al. | 29/25.35 |
| 6,255,761 B1 | * | 7/2001 | Benjamin | 310/334 |
| 6,404,107 B1 | | 6/2002 | Lazarus et al. | |
| 6,489,706 B2 | * | 12/2002 | Sliwa, Jr. et al. | 310/334 |

OTHER PUBLICATIONS

N. Hagood et al., "Improving transverse actuation of piezoceramics using interdigitated surface electrodes", SPIE vol. 1917, 1993, pp. 341–352.

A. A. Bent et al., "Anisotropic actuation with piezoelectric fiber composites", J. of Intelligent Material Systems and Structures, vol. 6, May 1995, pp. 338–349.

A. A. Bent et al., "Active fiber composites for structural actuation", Jan. 1997, 209 pgs.

Wilkie, W. K et al., "Low–cost piezocomposite actuator for structural control applications",*Smart Structures and Materials, 2000: Industrial and Commercial Applications of Smark Structures Technologies*, SPIE vol. 3991, (2000), pp. 323–334.

Janos, B. Z. Et al., "Magnetic particle doping for anisotropic matrix materials in actiave fiber composites", *Smart Materials Technologyes*, Newport Beach, CA, SPIE vol. 3675, (Mar. 1999), pp. 10–21.

Hagood, N.W., and Bent. A. A., Development of piezoelectric fiber composites for structural actuation, Proceedings of the 34th AIAA Structures, Structural Dynamics, and Materials Conference, AIAA Paper No. 93–1717, LaJolla, CA, 1993, pp. 3625–3638.

* cited by examiner

METHOD OF FABRICATING A PIEZOELECTRIC COMPOSITE APPARATUS

ORIGIN OF THE INVENTION

The invention described herein was made by employees of the United States Government and may be used by or for the Government for governmental purposes without the payment of any royalties thereon or therefor.

BACKGROUND OF THE INVENTION

1. Field of the Invention

The present invention is generally related to piezoelectric fiber composite strain actuators.

2. Description of the Related Art

Conventional piezoelectric fiber composite actuators are typically manufactured using a layer of extruded piezoelectric fibers encased in protective polymer matrix material. Interdigitated electrodes etched or deposited onto polymer film layers are placed on the top and bottom of the fibers to form a relatively thin actuator laminate. Protecting the fibers in a matrix polymer strengthens and protects the piezoelectric material. The resulting package is more flexible and conformable than actuators formed from monolithic piezoelectric wafers. These actuators can be easily embedded within or placed upon non-planar structures using conventional manufacturing techniques. In addition, the use of interdigitated electrode poling permits production of relatively large, directional in-plane actuation strains. The directional nature of this actuation is particularly useful for inducing shear (twisting) deformations in structures.

Unfortunately, the methods of manufacturing conventional piezoelectric fiber composites typically use relatively high cost, extruded, round piezoelectric fibers. Moreover, alternative methods of manufacture using square fibers, which are milled from lower cost monolithic piezoelectric wafers, have been unsuccessful due to the difficulty of aligning individual square fibers during actuator assembly without shifting and rolling. Rolled square fibers tend to expose sharp corners and edges which can sever the interdigitated electrode layers during the final process of actuator assembly. Both the round and square fiber approaches require individual handling of piezoelectric fibers during assembly, thereby resulting in relatively high manufacturing costs.

Another disadvantage of conventional piezoelectric fiber composite actuators is the requirement of relatively high operating voltages. High operating voltages are needed to produce electric fields which are sufficiently strong to propagate through the protective polymer material encasing the piezoelectric fibers. These electrode voltages are several times higher than those theoretically required to produce a given strain in the unprotected piezoelectric material. Additionally, round fibers have a low contact area with the electrode, thereby causing losses and decreased efficiency. To compensate for these losses, increased voltages are required. Conventional techniques for applying electrodes directly in contact with the piezoelectric fibers have thus far not been practical.

It is therefore an object of the present invention to provide an improved piezoelectric fiber composite strain actuator and a method for making same.

Still other objects and advantages of the present invention will in part be obvious and will in part be apparent from the specification.

SUMMARY OF THE INVENTION

The above and other objects and advantages, which will be apparent to one of skill in the art, are achieved in the present invention which is directed to, in one aspect, a method for fabricating a piezoelectric macro-fiber composite actuator. The first step comprises providing a structure comprising piezo-electric material which has a first side and a second side. First and second films are then adhesively bonded to the first and second sides, respectively, of the piezo-electric material. The first film has first and second conductive patterns formed thereon which are electrically isolated from one another and in electrical contact with the piezo-electric material. In one embodiment, the second film does not have any conductive patterns. The first and second conductive patterns of the first film each have a plurality of electrodes that cooperate to form a pattern of interdigitated electrodes. In another embodiment, the second film has a pair of conductive patterns similar to the conductive patterns of the first film.

In a related aspect, the present invention is directed to a piezoelectric macro-fiber composite actuator, comprising:

a structure consisting of piezo-electric material having a first side and a second side;

a first film bonded to the first side of the structure, the film further including first and second conductive patterns formed thereon, the first conductive pattern being electrically isolated from the second conductive pattern, both conductive patterns being in electrical contact with the piezo-electric material structure, the first and second conductive patterns each having a plurality of electrodes that cooperate to form a pattern of interdigitated electrodes; and     a second film bonded to the second side of the structure.

In a further aspect, the present invention is directed to a piezoelectric macro-fiber composite actuator, comprising:

a plurality of piezoelectric fibers in juxtaposition, each fiber having a first side and a second side, each pair of adjacent fibers being separated by a channel;

a first adhesive layer disposed over the first sides of the fibers and in the channel,     a first film bonded to the first sides of the fibers, the film further including first and second conductive patterns formed thereon, the first conductive pattern being electrically isolated from the second conductive pattern, both conductive patterns being in electrical contact with the piezo-electric material structure, the first and second conductive patterns each having a plurality of electrodes that cooperate to form a pattern of interdigitated electrodes;

a second adhesive layer disposed over the second sides of the fibers and into the channels; and     a second film bonded to the second sides of the fibers, the second film having a first conductive pattern and a second conductive pattern electrically isolated from the first conductive pattern of the second film, the first and second conductive patterns of the second film being in electrical contact with the fibers, the first and second conductive patterns of the second film each having a plurality of electrodes that cooperate to form a pattern of interdigitated electrodes.

BRIEF DESCRIPTION OF THE DRAWINGS

The features of the invention are believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

FIGS. 2–7B are perspective views illustrating preferred method steps of the present invention for making a piezoelectric macro-fiber composite actuator.

DETAILED DESCRIPTION OF THE INVENTION

In describing the preferred embodiments of the present invention, reference will be made herein to FIGS. 1–12B of the drawings in which like numerals refer to like features of the invention.

(1) Preferred Embodiment

Figure 1:
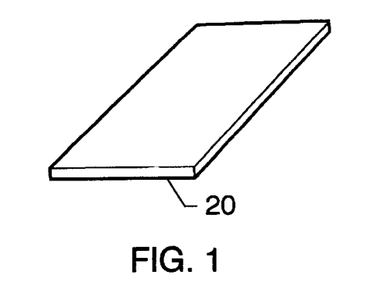
FIG. 1 is a perspective view of a typical piezoelectric wafer.

Referring to FIG. 1, the first step of the method of the present invention entails providing a ferro-electric wafer 20. For example, wafer 20 is fabricated from unelectroded, piezoelectric material. In one embodiment, PZT-5 piezoelectric ceramic material is used to fabricate the wafer 20. However, it is to be understood that any piezo-electric material may be used to fabricate wafer 20. In a preferred embodiment, piezoelectric wafer 20 has a thickness between about 0.002 and 0.010 inches.

Figure 2:
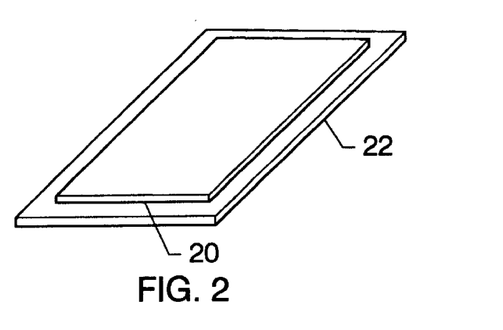

Referring to FIG. 2, the next step entails disposing piezoelectric wafer 20 on a relatively thin polymer backing sheet 22. In a preferred embodiment, the polymer backing sheet is moderately adhesive so as to facilitate handling during the subsequent steps of the fabrication method of the present invention.

Figures 3, 4:
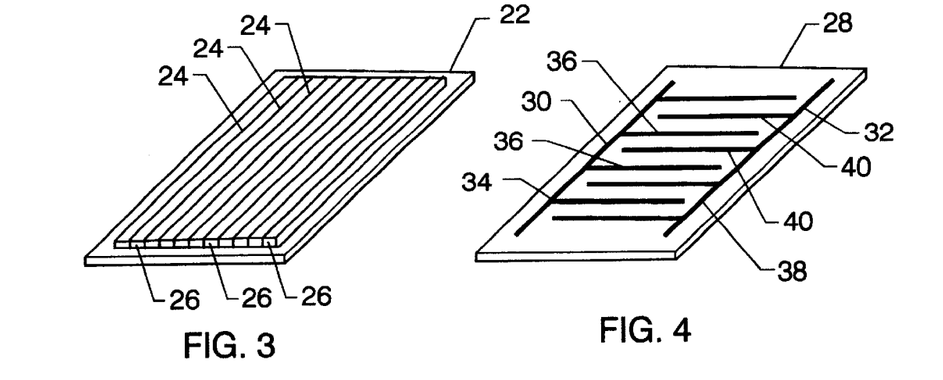

Referring to FIG. 3, the next step comprises forming a plurality of slots or channels 24 on piezoelectric wafer 20. While the slots 24 extend through substantially the entire thickness of wafer 20, they do not completely slice the underlying polymer backing sheet 22. This step results in the creation of a sheet of side-by-side piezoelectric macro-fibers 26 attached to the polymer backing layer 22. In a preferred embodiment, slots 24 are formed by a machining process that uses a commercially available computer-controlled dicing saw. However, other cutting methods may be used, e.g. lasers. In a preferred embodiment, each slot 24 has substantially the same width, which is between about 0.001 and 0.005 inches. However, each slot 24 can have a width less than 0.001 inch or greater than 0.005 inch. In a preferred embodiment, each macro-fiber 26 has a width between about one (1) and (2) two times the thickness of piezoelectric wafer 20. However, each macro-fiber 26 can have a width that is less than the thickness of piezoelectric wafer 20 or greater than twice the thickness of piezoelectric wafer 20.

Referring to FIG. 4, the next step is to fabricate electrically a pair of non-conducting film elements that will be bonded to macro-fibers 26. One such film element is film 28. Film 28 can be fabricated from any type of electrically non-conducting material. In one embodiment, the electrically non-conducting material is fabricated from a polyimide. One suitable material is Kapton® manufactured and marketed by Dupont®. In a preferred embodiment, film 28 has a thickness between about 0.0005 and 0.001 inches. Preferably, film 28 has width and length dimensions which are larger than the width and length of piezoelectric wafer 20. The reasons for this configuration will be discussed below.

Referring to FIG. 4, film 28 comprises two electrically conductive patterns 30 and 32. Conductive pattern 30 comprises a longitudinally extending portion 34 and interdigitated electrode fingers 36. Conductive pattern 32 comprises a longitudinally extending portion 38 and interdigitated electrode fingers 40. In one embodiment, conductive patterns or electrodes 30 and 32 are formed on film 28 using a photo-resist-and-etch process and pre-bonded polyimide-copper sheet laminate (e.g. Dupont® Pyralux® copper clad laminates). In a preferred embodiment, the thickness of the copper sheet material is between about 0.0005 and 0.001 inches. For example, a copper sheet having a thickness of about 0.0007 inch has provided good results. Although the foregoing description is in terms of conductive patterns 30 and 32 being fabricated from copper-sheet material, other types of sheet materials, e.g. gold, silver, etc, may also be used. The polyimide-conductive material laminate may also utilize an electro-deposited conductive layer instead of a pre-bonded conductive sheet, such as rolled and annealed copper.

Referring to FIG. 4, in a preferred embodiment, the center-to-center spacing of longitudinally extending portions 34 and 38 is about six times the thickness of piezoelectric wafer 20, and the spacing between interdigitated electrodes or "fingers" 36 and 40 is about equal to the thickness of piezoelectric wafer 20. The center-to-center spacing of longitudinally extending portions 34 and 38 and interdigitated electrodes or "fingers" 36 and 40, however, can be other than described above. Furthermore, the width of conductive patterns 30 and 32 may have any suitable width.

Referring to FIGS. 2–4, film 28 has width and length dimensions that are larger than the width and length of piezoelectric wafer 20 so as to permit the placement of longitudinally extending portions 34 and 38 of conductive patterns 30 and 32, respectively, away from piezoelectric wafer 20. This configuration significantly lessens the potential for cracking of macro-fibers 26 caused by highly non-uniform electrical field distribution in regions beneath and adjacent to the longitudinally extending portions 34 and 38. Additionally, this packaging concept affords a sealed electrical system protected from the environment.

Figure 5:
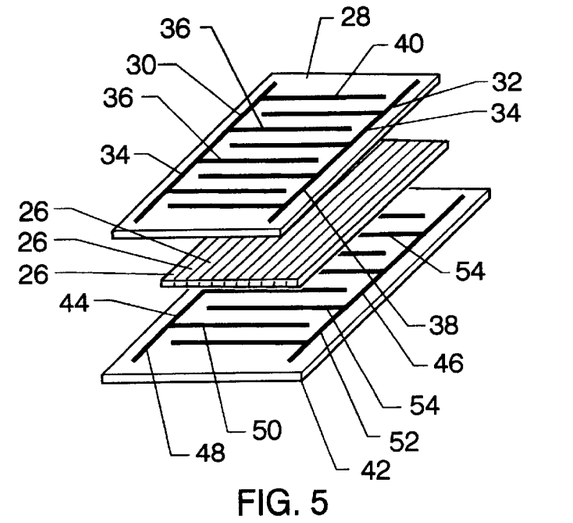

Referring to FIGS. 4 and 5, a second film 42 is fabricated in accordance with the steps described above. In one embodiment, film 42 comprises conductive patterns or electrodes 44 and 46. Conductive pattern 44 comprises longitudinally extending portion 48 and interdigitated electrodes or fingers 50. Similarly, conductive pattern 46 comprises longitudinally extending portion 52 and interdigitated electrodes or fingers 54. Conductive patterns 44 and 46 of film 42 are "mirror images" of conductive patterns 30 and 32., respectively, of film 28. The next step comprises positioning films 28 and 42 as shown in FIG. 5 such that film 28 confronts one side or face of macro-fibers 26 and film 42 confronts the other side of macro-fibers 26. Conductive patterns 30 and 32 of film 28 are directly aligned wit conductive patterns 44 and 46 of film 42. Thus, conductive patterns 30 and 32 are in "mirror-image" alignment with conductive patterns 44 and 46 across the thickness of macro-fibers 26. Although film 42 has been described in the foregoing description as having conductive patterns thereon, film 42 may be configured without any conductive patterns.

Figures 6A, 6B:
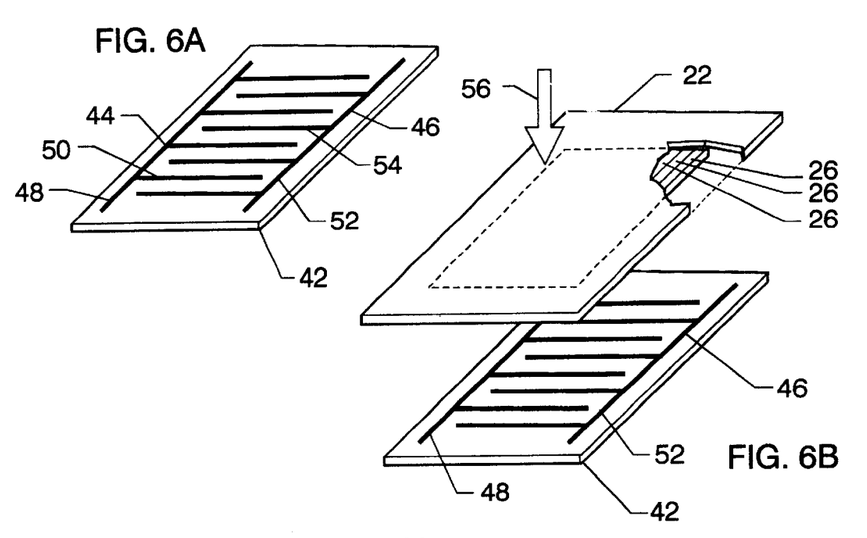
Figures 7A, 7B:
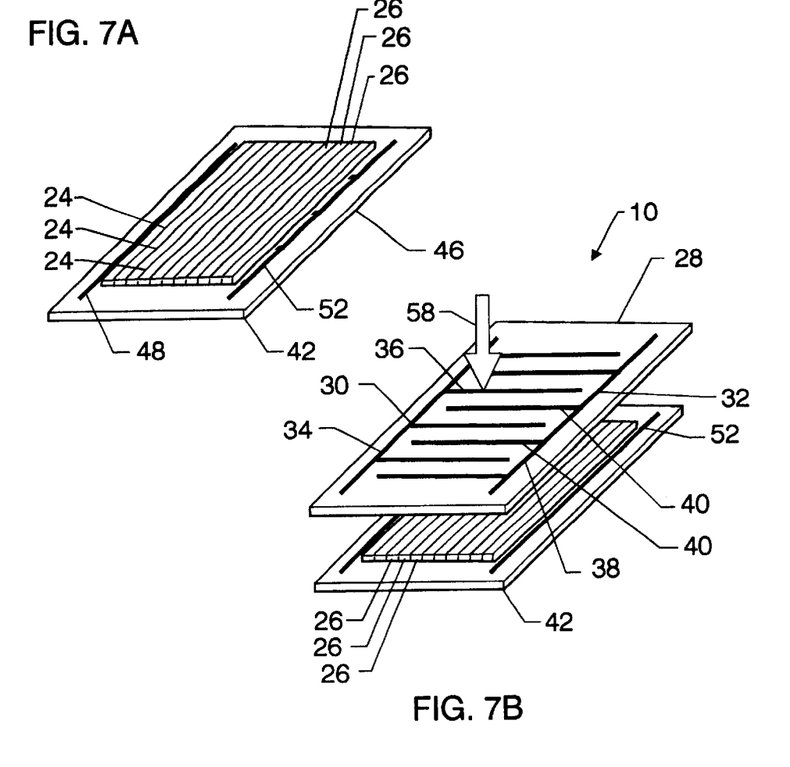

Referring to FIGS. 6A, 6B, 7A and 7B, films 28 and 42 are bonded with an adhesive to macro-fibers 26 to form a flexible laminate. In a preferred embodiment, the adhesive is a two-part liquid epoxy to bond films 28 and 42 to macro-fibers 26. An example of such a liquid epoxy is Scotchweld DP-460 epoxy manufactured by 3M Company. However, other types of bonding materials can be used, e.g. urethane, acrylic, etc. Referring to FIG. 6A, the first step in the bonding process is to coat the electrode face of film 42 with a relatively thin layer of liquid epoxy. Referring to FIG. 6B, sheet 22 and macro-fibers 26 are then placed on film 42 such that macro-fiber 26 contacts the epoxy-coated face of electrode film 42. Light pressure, indicated by arrow 56, and heat are applied in a vacuum to partially cure the epoxy layer to affix the macro-fibers to electrode film 42. After the partial cure is complete, polymer backing sheet 22, previously used for handling of macro-fibers 26, is peeled away and discarded. Referring to FIG. 7a, macro-fibers 26 are now attached to the bottom electrode film 42 by the epoxy. An additional coat of liquid epoxy is now applied to macro-fibers 26 in order to fill all machined slots 24 between adjacent fibers 26. Application of epoxy in this manner serves to substantially eliminate air pockets between adjacent, alternately charged electrode fingers 36, 40, 50 and 54 in the final assembly. The elimination of these air pockets substantially reduces the probability of electrical arcing or permanent shorts which would render the actuator inoperable.

Referring to FIGS. 6B, 7A and 7B, after slots 24 are filled with the epoxy, the next step is to apply a relatively thin coat of epoxy to the electroded face of upper film 28. Next, film 28 is placed epoxy side down onto the previously coated surface of macro-fibers 26 such that conductive electrode patterns 30, 32 and 44, 46 of films 28 and 42, respectively, are substantially aligned. The next step entails applying moderate pressure, indicated by arrow 58, and heat to the assembly of films 28, 42 and macro-fibers 26. The heat and pressure are applied in a vacuum until a substantially complete, void-free cure of the epoxy is attained. Application of this pressure also forces the relatively thick copper conductive patterns or electrodes 30, 32 and 44, 46 to contact and rest upon the flat surfaces of the macro-fibers 26. Such contact between the relatively thick copper conductive patterns or electrodes 30, 32 and 44, 46 and the flat surfaces of macro-fibers 26 creates a bond line between the conductive patterns or electrodes 30, 32 and 44, 46 and fiber 26 that is extremely thin or "starved", resulting in only a minimal attenuation of the actuator's electric field produced when voltage is applied. The bond line between the unelectroded portions of films 28 and 42 (i.e. the portions of films 28 and 42 having no conductive pattern) and fibers 26 is sufficiently thick to keep films 28 and 42 attached. This process results in a longitudinal mode piezoelectric fiber actuator 10.

Figure 8:
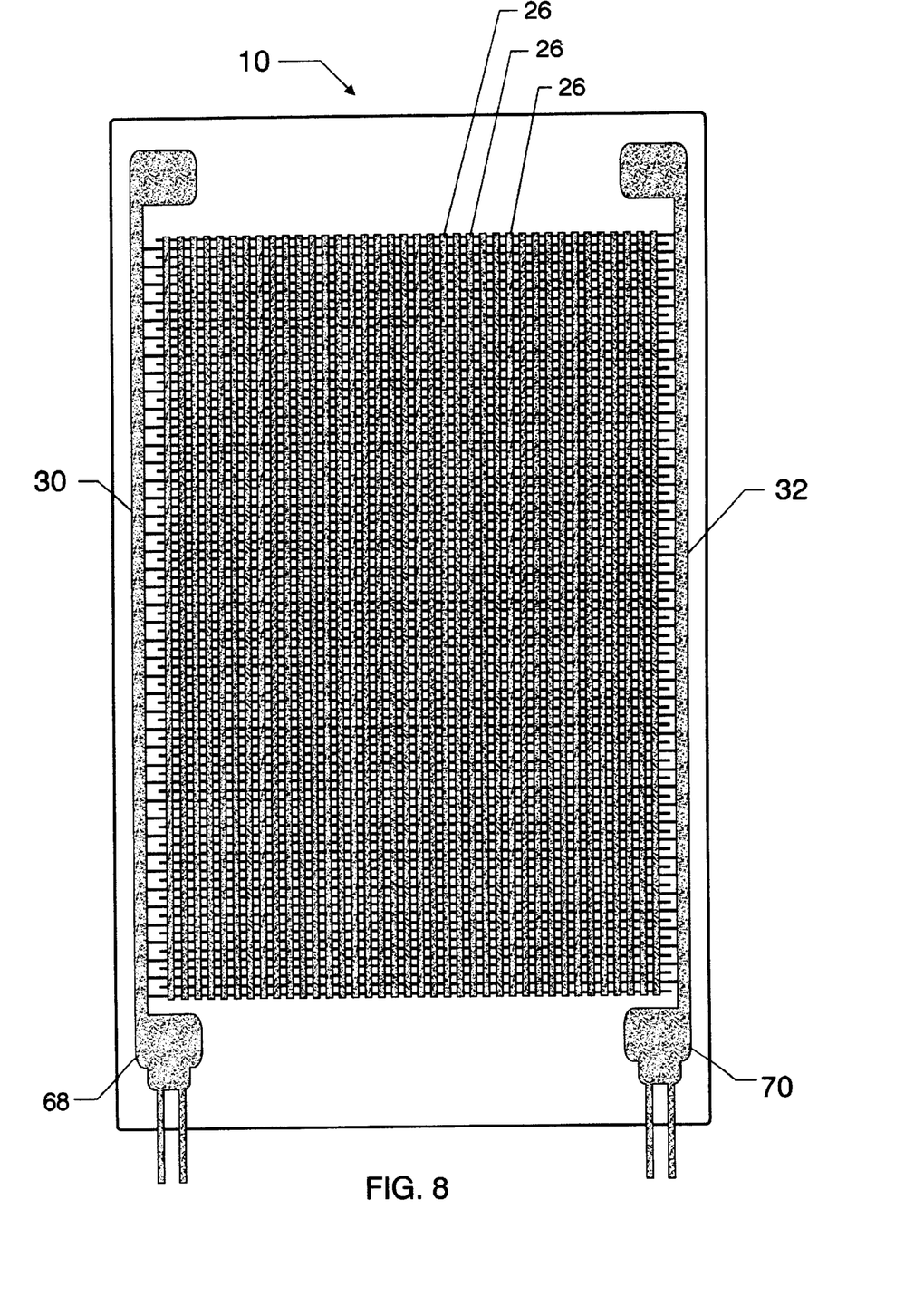
FIG. 8 is a top plan view of the assembled piezoelectric macro-fiber composite actuator having electrically conductive extensions attached thereto.

As shown in FIG. 8, conductive patterns 30 and 32 are provided with electrically conductive extensions 68 and 70, respectively. During operation, an external power supply (not shown) is electrically connected to the extensions 68 and 70 in a manner such that at any one moment in time, opposite electrical polarity is supplied to interdigitated fingers 36, 40 and 50 and 54. This polarity generates electric fields directed along the length of fibers 26 in the regions between adjacent interdigitated electrode fingers 36 and 40 and between fingers 50 and 54.

The interdigitated electrodes 36, 40 and 50, 54 are also used for polarizing the piezoelectric fibers 26. Polarization of the macro-fibers 26 is typically required before operating the device as an actuator. Polarization is performed by applying a steady voltage across alternate electrode fingers 36, 40 and 50, 54. In one embodiment, a voltage which generates an average electric field intensity of approximately 300% of the room temperature coercive electric field of the macro-fibers 26 is used. Such voltage is applied to the actuator for approximately 20 minutes at room temperature. Other poling techniques, as are well understood in the art, may also be used.

Subsequent application of a voltage to conductive patterns 30, 32, 44 and 46 produces an induced strain in macro-fibers 26. The largest strain produced occurs along the fiber length direction, with a contractile strain occurring in the transverse direction.

(2) Alternate Embodiments

Figure 9:
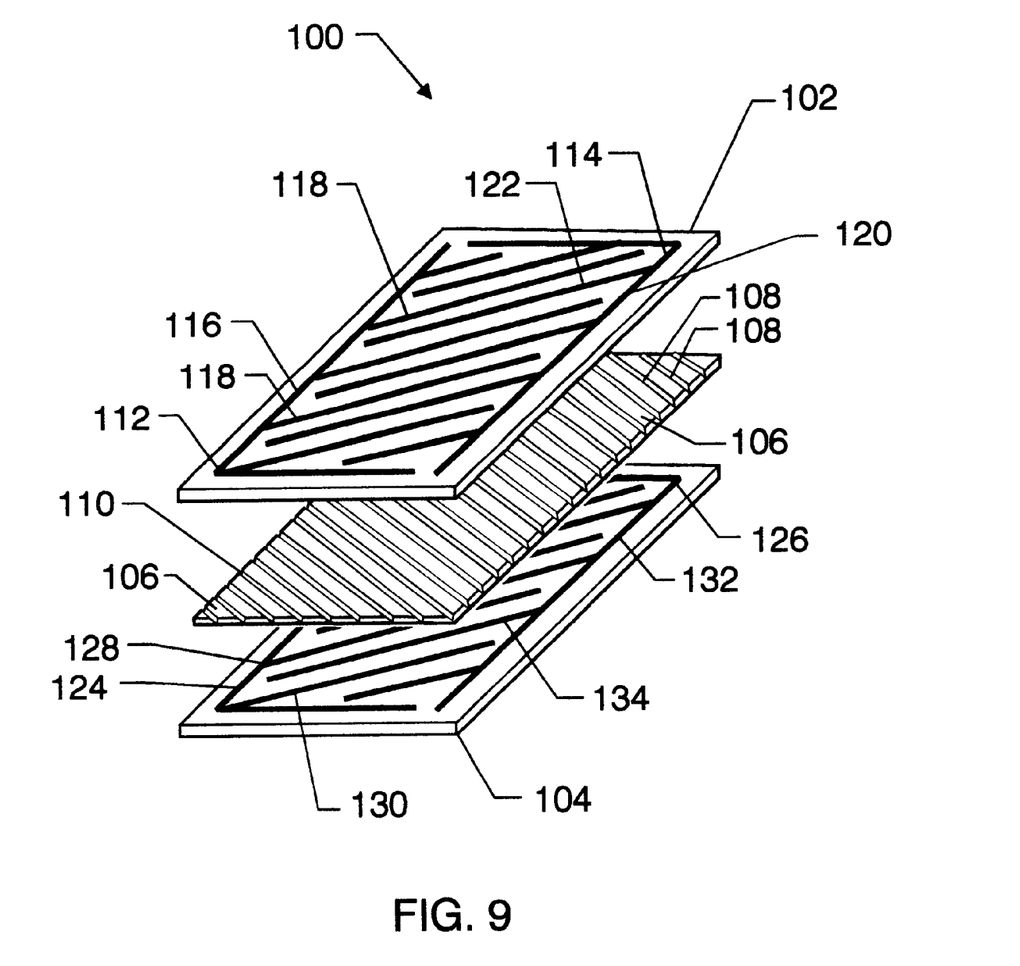
FIG. 9 is an exploded, perspective view illustrating an actuator fabricated in accordance with an alternate embodiment of the method of the present invention.

FIG. 9 depicts an alternate piezoelectric fiber actuator 100 of the present invention. Shear-mode actuator 100 is configured to allow continuous twisting moments to be easily produced in a host structure, e.g. high aspect ratio structures, beams, spars, etc. Shear-mode actuator 100 generally comprises films 102, 104 and piezoelectric fibers 106. Films 102, 104 and fibers 106 are adhesively bonded together using an epoxy as described above. Piezoelectric fibers 106 have separated slots 108 which are the result of a cutting or slicing process as has been previously described. Fibers 106 define a longitudinally extending edge 110. Slots 108 are formed at an angle with respect to longitudinally extending edge 110. Preferably, each slot 108 is formed at a 45° angle with respect to the longitudinal extending edge 110 because such an angular orientation provides optimum results in inducing piezoelectric shear stresses within a host structure. However, slots 108 may be formed at a different set of angles with respect to the longitudinally extending edge 110.

Film 102 includes two conductive patterns 112 and 114 formed thereon. Conductive pattern 112 includes a longitudinally extending portion 116 and interdigitated electrodes or fingers 118. Similarly, conductive pattern 114 includes a longitudinally extending portion 120 and interdigitated electrodes or fingers 122. As shown in FIG. 9, fingers 118 are angulated with respect to longitudinally extending portion 116. Similarly, fingers 122 are angulated with respect to longitudinally extending portion 120. In a preferred embodiment, fingers 118 and 122 are formed at a 45° angle with respect to portions 116 and 120, respectively, so that fingers 118 and 120 are substantially perpendicular to the fibers 106.

In one embodiment, film 104 includes two conductive patterns 124 and 126 formed thereon. Conductive pattern 124 includes a longitudinally extending portion 128 and interdigitated electrodes or fingers 130. Similarly, conductive pattern 126 includes a longitudinally extending portion 132 and interdigitated electrodes or fingers 134. As shown in FIG. 9, fingers 130 are angulated with respect to longitudinally extending portion 128. Similarly, fingers 134 are angulated with respect to longitudinally extending portion 132. In a preferred embodiment, fingers 130 and 134 are formed at a 45° angle with respect to portions 128 and 132, respectively, so that fingers 130 and 134 are substantially perpendicular to the fibers 106. Although film 104 has been described in the foregoing description as having conductive patterns thereon, film 104 may also be configured without any conductive patterns. Films 102 and 104 are bonded with an adhesive to macro-fibers 106 in a process similar to the process previously described for assembly of piezoelectric fiber actuator 10 and shown by FIGS. 6A, 6B, 7A, and 7B.

Actuator 100 further includes four electrical conductors (not shown) wherein each electrical conductor is electrically connected to a corresponding one of conductive patterns 112, 114, 124 and 126. In a preferred embodiment, each of the electrical conductors are positioned near the edge of films 102, 104 and function to electrically connect actuator 100 to external electronic circuitry (not shown). The four electrical conductors apply electrical power to actuator 100 in the same manner as described above.

Figure 10:
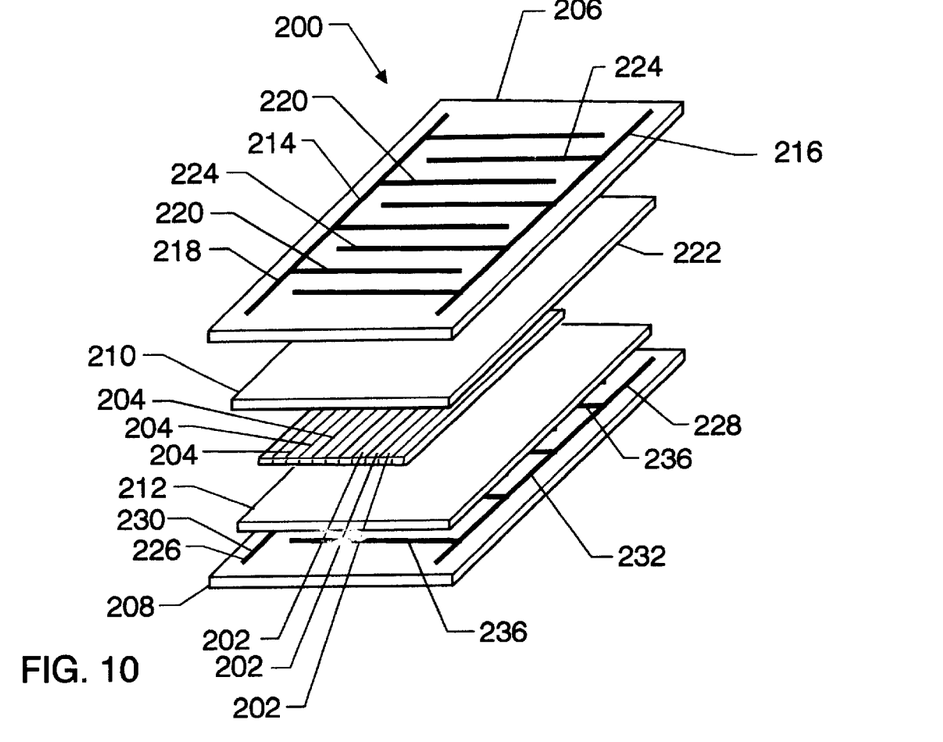
FIG. 10 is an exploded, perspective view illustrating an actuator fabricated in accordance with a further embodiment of the method of the present invention.

FIG. 10 illustrates a further embodiment of the actuator of the present invention. Actuator 200 generally comprises a plurality of piezoelectric macro-fibers 202 separated by slots 204, and films 206, 208, 210 and 212. Slots 204 are formed by the slicing or cutting methods previously described herein. Films 206 and 208 are generally the same in construction as films 28 and 42, respectively, discussed above.

Film 206 includes two conductive patterns 214 and 216 formed thereon. Conductive pattern 214 includes a longitudinally extending portion 218 and interdigitated electrodes or fingers 220. Similarly, conductive pattern 216 includes a longitudinally extending portion 222 and interdigitated electrodes or fingers 224. As shown in FIG. 10, fingers 220 and 224 are substantially perpendicular to longitudinally extending portions 218 and 222, respectively.

In one embodiment, film 208 comprises two conductive patterns 226 and 228. Conductive pattern 226 includes a longitudinally extending portion 230 and interdigitated electrodes or fingers (not shown). Similarly, conductive pattern 228 includes a longitudinally extending portion 232 and interdigitated electrodes or fingers 236. The fingers of film 208 are substantially perpendicular to longitudinally extending portions 230 and 232. Film 208 may also be configured without any conductive patterns.

Actuator 200 further comprises anisotropically conductive films or sheets 210 and 212 positioned on the top and bottom of piezoelectric macro-fibers 202. Each film 210 and 212 has generally the same surface area as the total surface area of piezoelectric macro-fibers 202. Films 210 and 212 are used to bond films 206 and 208 to the piezoelectric macro-fibers 202. Each film 210 and 212 comprises a thermoset/thermoplastic adhesive matrix. In one embodiment, the adhesive matrix has a thickness between about 0.0001 and 0.002 inches. The adhesive matrix has randomly loaded conductive particles. These conductive particles provide conductive paths through the thickness of the adhesive film, but not through the plane of the film. This pathing arrangement permits the fingers of films 206 and 208 to be in direct electrical contact with the underlying piezoelectric fibers 202 while remaining electrically isolated from adjacent, oppositely charged fingers. In one embodiment, the conductive particles have a diameter of about 0.0005 inch. Films 210 and 212 comprise Z-Axis Film, product no. 3M 5303R, manufactured by 3M Company, Inc. However, other films having generally the same anisotropically conductive characteristics as the aforementioned Z-Axis Film may be used.

Referring to FIG. 10, before final assembly of actuator 200, slots 204 are filled with an electrically non-conductive matrix epoxy to prevent the development of air pockets. The application of the epoxy is implemented in generally the same manner as previously described for assembly of actuator 10.

Referring to FIG. 10, the use of films 210, 212 to bond films 206 and 208 to piezoelectric macro-fibers 202 creates relatively strong bond lines that are maintained beneath and between fingers of films 206 and 208. In an alternate embodiment, films 206 and 208 may be added during the fabrication of the shear-mode actuator previously described and shown in FIG. 9.

Figure 11:
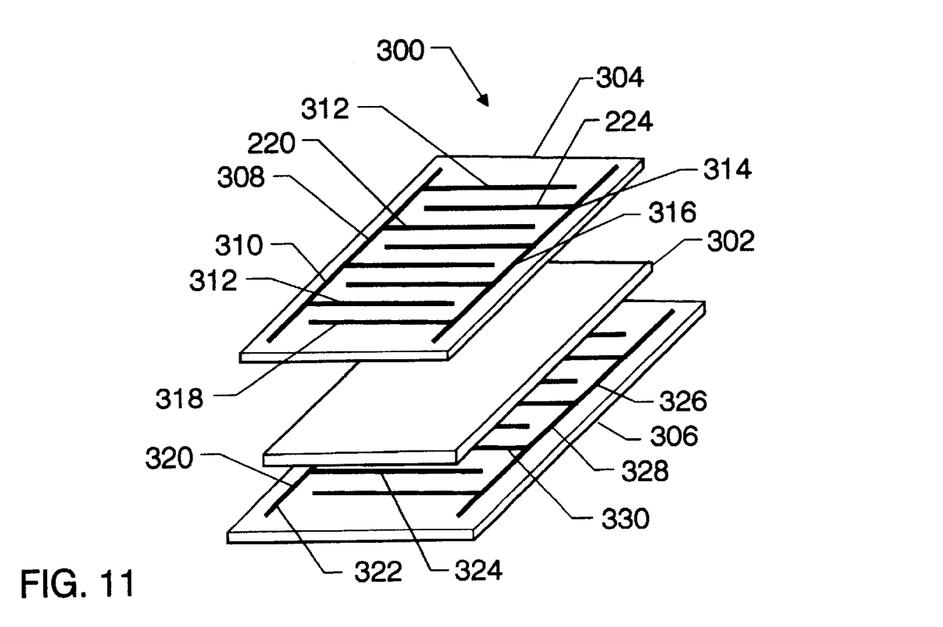
FIG. 11 is an exploded, perspective view illustrating an actuator fabricated in accordance with yet another embodiment of the method of the present invention.

FIG. 11 shows another embodiment of the actuator of the present invention. Actuator 300 generally comprises a monolithic piezoelectric wafer 302 and films 304 and 306. Wafer 302 may be produced as a longitudinal-mode or shear-mode actuator. Films 304 and 306 have electrode patterns and are generally the same in construction as films 28 and 42 described above and shown in FIGS. 4 and 5.

Film 304 comprises a conductive pattern 308 which has a longitudinally extending portion 310 and interdigitated electrodes or fingers 312. Film 304 further comprises conductive pattern 314, which has a longitudinally extending portion 316 and interdigitated electrodes or fingers 318. As shown in FIG. 11, fingers 312 and 318 are substantially perpendicular to longitudinally extending portions 310 and 316, respectively.

In one embodiment, film 306 comprises a conductive pattern 320 having a longitudinally extending portion 322 and interdigitated electrodes or fingers 324. Film 306 further comprises a conductive pattern 326 having a longitudinally extending portion 328 and interdigitated electrodes or fingers 330. As shown in FIG. 11, fingers 324 and 330 are substantially perpendicular to the longitudinally extending portions 322 and 328, respectively. Film 306 may also be configured without any conductive patterns.

Films 304 and 306 may be bonded to wafer 302 by any of the methods previously described. The omission of the machined slots in wafer 302 significantly reduces the per-unit cost of actuator 300 and provides a relatively high actuation-efficiency device. Additionally, the lamination effect of the attached electrode films 304 and 306 provides actuator 300 with a predetermined degree of flexibility and conformability which, although not as great as actuators 10, 100 and 200, makes actuator 300 suitable for applications wherein endurance and fatigue life are not major considerations, for example, launch vehicle payload shrouds, torpedo bodies, missile stabilizer fins, etc.

Figure 12A:
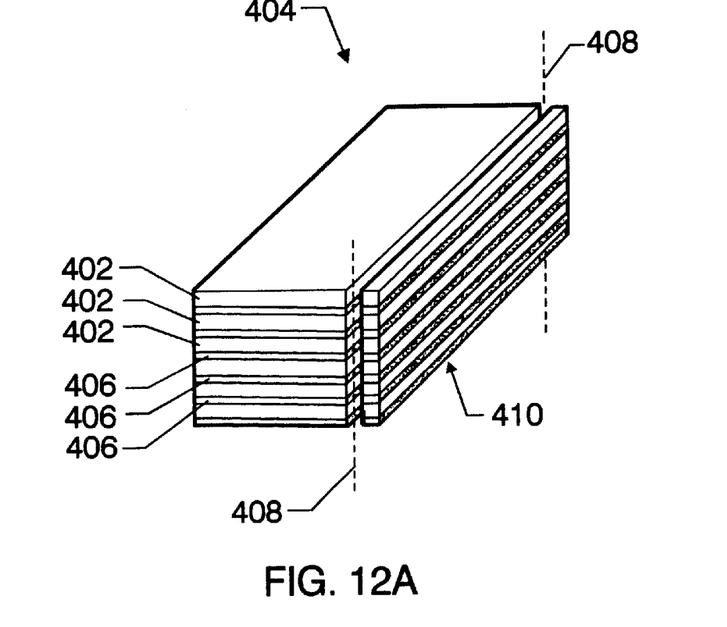
FIGS. 12A and 12B are perspective views illustrating an actuator fabricated in accordance with yet a further embodiment of the method of the present invention.
Figure 12B:
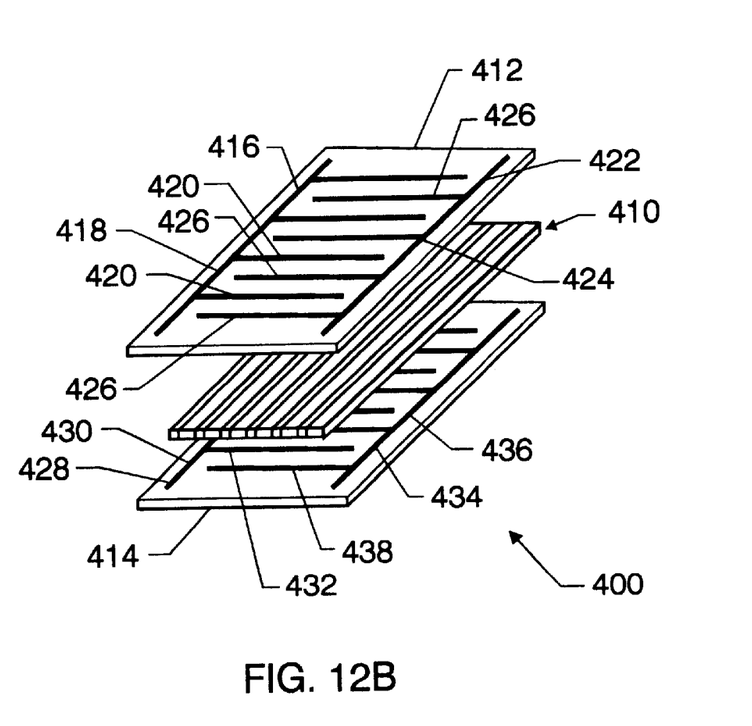

A further embodiment of the actuator of the present invention is given in FIGS. 12A and 12B. The first step in fabricating actuator 400 is to bond together a plurality of relatively thin piezoelectric wafers 402 to form a stack 404. In a preferred embodiment, a liquid epoxy as previously described is used to bond together the wafers 402. Stack 404 may be of almost any height. In one embodiment, the height of stack 404 is about 0.25 inch. In a preferred embodiment, the thickness of bond lines 406 between adjacent wafers 402 is between about 0.125 and 0.25 times the nominal thickness of the individual piezoelectric wafers 402. After stack 404 is bonded, it is cured at relatively moderate pressure and temperature to form a substantially void-free bonded stack. In a preferred embodiment, the aforementioned pressure and temperature are applied under a vacuum.

Next, stack 404 is sliced parallel to the thickness direction and along the length direction, as indicated by dotted lines 408, to provide a plurality of relatively thin, piezoelectric sheets 410. In one embodiment, a wafer dicing saw is used to cut fiber sheets 410. However, other cutting methods may be used. Fiber sheets 410 may be handled and packaged in the same manner as monolithic piezoelectric wafers. In one embodiment, the thickness of each sheet 410 is about equal to the thickness of one of the piezoelectric wafers 402 used to form stack 404. However, each sheet 410 may have a thickness that is less than or greater than the thickness of one of the piezoelectric wafers 402.

Referring to FIG. 12B, sheet 410 is positioned between films 412 and 414. Film 412 comprises a conductive pattern 416, which has a longitudinally extending portion 418 and interdigitated electrodes or fingers 420, and a conductive pattern 422, which has a longitudinally extending portion 424 and interdigitated electrodes or fingers 426. As shown in FIG. 12B, fingers 420 and 426 are substantially perpendicular to longitudinally extending portions 418 and 424, respectively.

Film 414 comprises a conductive pattern 428 having a longitudinally extending portion 430 and interdigitated electrodes or fingers 432. Film 414 further comprises a conductive pattern 434 having a longitudinally extending portion 436 and interdigitated electrodes or fingers 438. Fingers 432 and 438 are substantially perpendicular to longitudinally extending portions 430 and 436, respectively. Film 414 may also be configured without any conductive patterns. Films 412 and 414 are adhesively bonded to sheet 410 via a liquid epoxy or using an anisotropically conductive film as previously described.

The configuration shown in FIGS. 12A and 12B has two significant advantages. First, the possibility of bonding to a surface skin is virtually eliminated. Second, all the macro-fibers of sheets 410 are pre-aligned.

(3) Advantages Over Prior Art Actuators And Methods

The method of the present invention substantially eliminates the need to manufacture and individually handle large numbers of piezoelectric fibers. Thus, production time and handling costs associated with packaging piezoelectric fiber composite actuators are significantly reduced. The method of the present invention is easily controlled and precise, which greatly enhances the repeatability and uniformity of the actuators produced. The method of the present invention permits square fibers to be manufactured and easily aligned within the actuator package without the possibility of damage to the actuator electrodes. Thus, the difficulties associated with the use of square cross-section piezoelectric fibers are virtually eliminated. The use of square fibers in accordance with the present invention instead of round fibers allows the volume fraction of piezoelectric material within the actuator package to be increased, thereby improving the actuation stress capability of the actuator. The use of the relatively thick copper conductive patterns, which are attached via liquid epoxy or anisotropically conductive adhesive, also provide for an unimpeded electrical connection to be made between the piezoelectric material and the electrodes. As a result, the electric field transfer efficiency of the actuator electrodes is significantly improved, which in turn increases the strain produced per unit applied voltage. A further advantage is that the square or rectangular fibers have a substantially flat contact area with the electrodes. This flat contact area is relatively greater than the contact area achieved with round fibers.

The polyimide films each have width and length dimensions that are larger than the width and length of piezoelectric wafer so as to permit the placement of longitudinally extending portions of the conductive patterns (e.g. portions 34 and 38 of conductive patterns 30 and 32, respectively) away from the piezoelectric wafer. This configuration significantly lessens the potential for cracking of the macro-fibers caused by highly non-uniform electrical field distribution in regions beneath and adjacent to the longitudinally extending portions of the conductive patterns. Additionally, this packaging concept affords a sealed electrical system that is protected from the environment.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A method of fabricating a piezoelectric composite apparatus, comprising the steps of:

providing a structure comprising a monolithic piezoelectric material having a first side and a second side;

providing a backing sheet having an adhesive side;

positioning the structure on the backing sheet such tat the first side of the structure is attached to the adhesive side of the backing sheet;

slicing through the structure positioned on the backing sheet to provide a plurality of piezoelectric fibers in juxtaposition, the plurality of piezoelectric fibers having first and second sides that correspond, respectively, to the first and second sides of the structure;

providing a first film having a first conductive pattern and a second conductive pattern formed thereon, the first conductive pattern being electrically isolated from the second conductive pattern, the first and second conductive patterns each having a plurality of electrodes that cooperate to form a pattern of interdigitated electrodes;

providing a second film;

bonding the second film to the second side of the plurality of piezoelectric fibers;

removing the backing sheet from the first side of the plurality of piezoelectric fibers; and bonding the first film to the first side of the plurality of piezoelectric fibers such that the conductive patterns of the first film electrically contact the plurality of piezoelectric fibers.

2. The method according to claim 1 wherein the monolithic piezoelectric material comprises a wafer of piezoelectric material.

3. The method according to claim 1 wherein the backing sheet is fabricated from a polymer.

4. The method according to claim 1 wherein each fiber has a substantially rectangular cross-section.

5. The method according to claim 1 wherein each pair of adjacent fibers are separated by a channel.

6. The method according to claim 1 wherein at least one of the conductive patterns is made of copper.

7. The method according to claim 1 wherein the second film has a first conductive pattern and a second conductive pattern, the first conductive pattern of the second film being electrically isolated from the second conductive pattern of the second film, the first and second conductive patterns of the second film each having a plurality of electrodes that cooperate to form a pattern of interdigitated electrodes, and the step of bonding the first film further comprises the step of positioning the first film so that the conductive patterns of the first film are substantially aligned with the conductive patterns of the second film.

8. The method according to claim 7 further comprising attaching electrically conductive extensions to the first and second conductive patterns of the first film and attaching electrically conductive extensions to the first and second conductive patterns of the second film.

9. The method according to claim 7 wherein the first film and the second film each have a longitudinally extending axis and the step of slicing produces a plurality of piezoelectric fibers that extend in the direction of the longitudinal axes of the first and second films.

10. The method according to claim 9 wherein each interdigitated electrode of the first and second conductive patterns extends in a direction that is substantially perpendicular to the longitudinally axes of the first and second films and substantially perpendicular to the longitudinal direction of the piezoelectric fibers.

11. The method according to claim 1 wherein the step of slicing provides channels intermediate each pair of adjacent piezoelectric fibers, and the step of bonding the second film further comprises applying an epoxy to the plurality of piezoelectric fibers to fill in the channels and eliminate air pockets.

12. The method according to claim 1 wherein the second film has a first side and a second side, and the step of bonding the second film comprises:

applying an adhesive layer to the first side of the second film;

placing the first side of the second film on the second side of the plurality of piezoelectric fibers; and curing the adhesive layer.

13. The method according to claim 12 wherein the first film has a first side and a second side, and the step of bonding the first film comprises:

applying a second adhesive layer to the first side of the first film;

placing the first side of the first film on the first side of the plurality of piezoelectric fibers; and curing the second adhesive layer.

14. The method according to claim 1 further comprising the step of:

attaching electrically conductive extensions to the first and second conductive patterns.

15. A method of fabricating a piezoelectric composite apparatus, comprising the steps of:

providing a structure comprising a monolithic piezoelectric material having a first side and a second side;

providing a backing sheet having an adhesive side;

positioning the structure on the backing sheet such that the first side of the structure is attached to the adhesive side of the backing sheet;

cutting through the structure positioned on the backing sheet to provide a plurality of piezoelectric fibers in juxtaposition, the plurality of piezoelectric fibers having first and second sides that correspond, respectively, to the first and second sides of the structure;

providing a first film having a first conductive pattern and a second conductive pattern formed thereon, the first conductive pattern being electrically isolated from the second conductive pattern, the first and second conductive patterns each having a plurality of electrodes that cooperate to form a pattern of interdigitated electrodes;

providing a second film;

bonding the second film to the second side of the plurality of piezoelectric fibers;

peeling the backing sheet away from the first side of the plurality of piezoelectric fibers; and bonding the first film to the first side of the plurality of piezoelectric fibers such that the conductive patterns of the first film electrically contact the plurality of piezoelectric fibers.

* * * * *